United States Patent [19]

Giannella

[11] Patent Number: 5,016,080
[45] Date of Patent: May 14, 1991

[54] PROGRAMMABLE DIE SIZE CONTINUOUS ARRAY

[75] Inventor: Piccolo G. Giannella, Saratoga

[73] Assignee: Exar Corporation, San Jose, Calif.

[21] Appl. No.: 277,169

[22] Filed: Nov. 29, 1988

Related U.S. Application Data

[63] Continuation-in-part of Ser. No. 225,094, Oct. 7, 1988, abandoned.

[51] Int. Cl.⁵ .................... H01L 37/10; H01L 27/15
[52] U.S. Cl. ........................... 357/45; 357/40; 357/41
[58] Field of Search .................. 357/40, 45, 68, 41

[56] References Cited

U.S. PATENT DOCUMENTS

| | | | |
|---|---|---|---|
| 4,413,271 | 11/1983 | Gontowski et al. | 357/40 |
| 4,479,088 | 10/1984 | Stopper | 324/132 |
| 4,682,202 | 7/1987 | Tanizawa | 357/41 |
| 4,733,288 | 3/1988 | Sato | 357/40 |
| 4,829,014 | 5/1989 | Yerman | 437/8 |
| 4,835,592 | 5/1989 | Zommer | 357/68 |

FOREIGN PATENT DOCUMENTS

| | | | |
|---|---|---|---|
| 55-68668 | 5/1980 | Japan | 357/45 |
| 59-107532 | 6/1984 | Japan | 357/45 |
| 59-197151 | 11/1984 | Japan | 357/45 |
| 60-49648 | 3/1985 | Japan | 357/45 |
| 60-136332 | 7/1985 | Japan | 357/45 |
| 61-272960 | 12/1986 | Japan | 357/45 |
| 0114259 | 5/1987 | Japan | 357/40 |
| 62-174941 | 7/1987 | Japan | 357/45 |
| 62-229857 | 10/1987 | Japan | 357/45 |
| 63-187648 | 8/1988 | Japan | 357/45 |
| 63-291452 | 11/1988 | Japan | 357/45 |

OTHER PUBLICATIONS

Article "Exar Drives Down the Cost of Arrays", Electronics, No 5, Sep. 1988, Hasbrouck Heights, N.J.

Primary Examiner—Rolf Hille
Assistant Examiner—Minhloan Tran
Attorney, Agent, or Firm—Townsend and Townsend

[57] ABSTRACT

The present invention covers a semiconductor wafer for semi-custom use in which there are no scribe lines in at least one direction. Electrically isolated cells are provided throughout the wafer. The scribe lines can thus be arbitrarily placed according to an individual customer's instructions, with the isolated cells near the scribe line being covered with metalization to form a bonding pad. Preferably, scribe lines are provided in one direction, either horizontal or vertical. This allows fixed bonding pads to be placed near these scribe lines and allows special components, such as power transistors and ESD protection systems to be placed near the fixed bonding pads. This provides better silicon efficiency than the embodiment with no fixed scribe lines by simplifying the routing. The components which need to be near the bonding pads are placed there, rather than being located randomly throughout the wafer. The customer can then specify a length of a cell which has a fixed height.

18 Claims, 12 Drawing Sheets

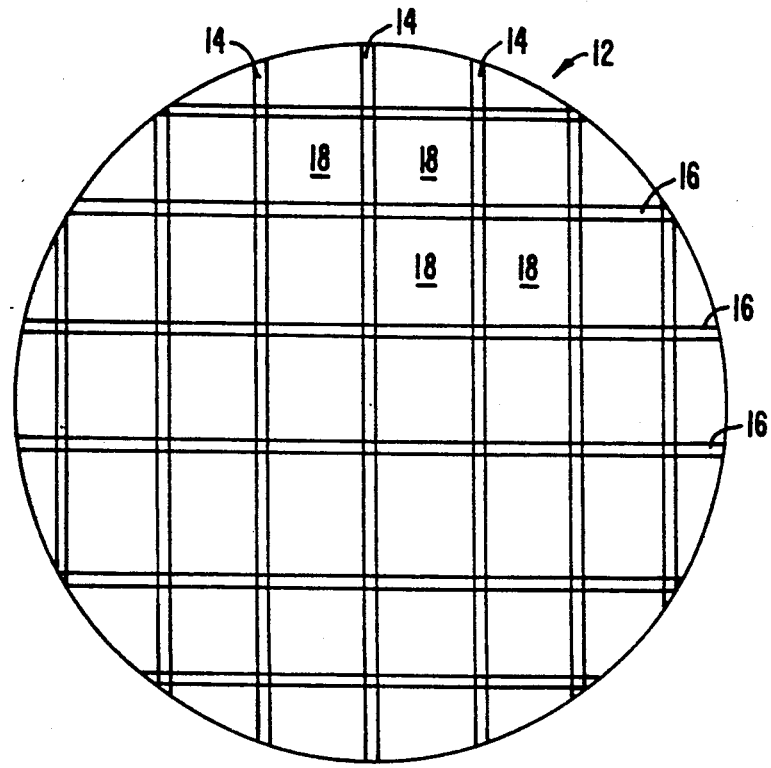
FIG._1.   PRIOR ART
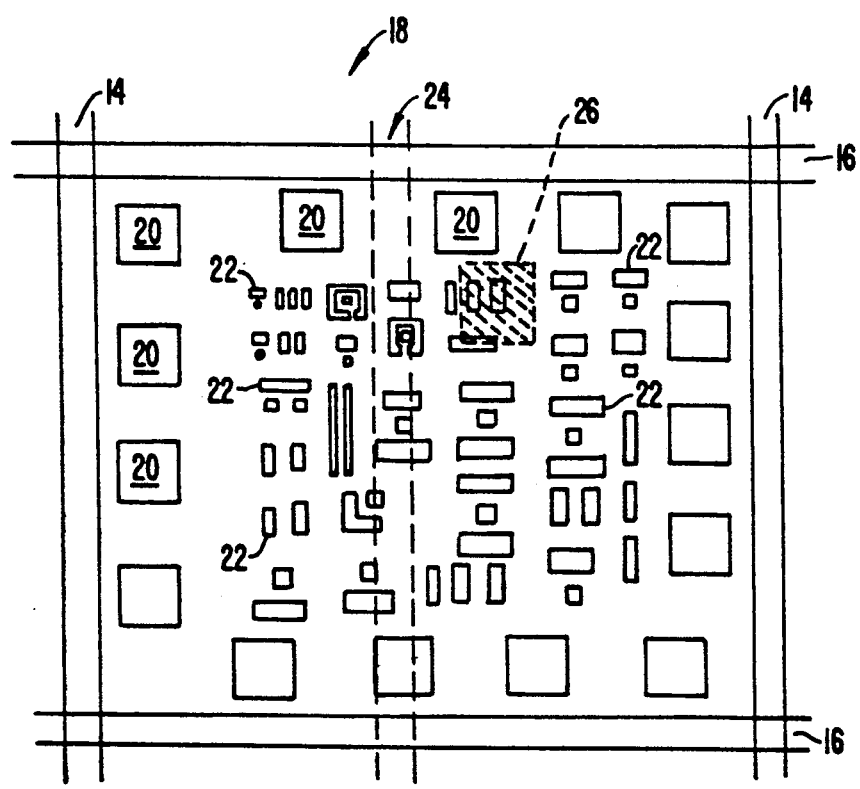
FIG._2.   PRIOR ART

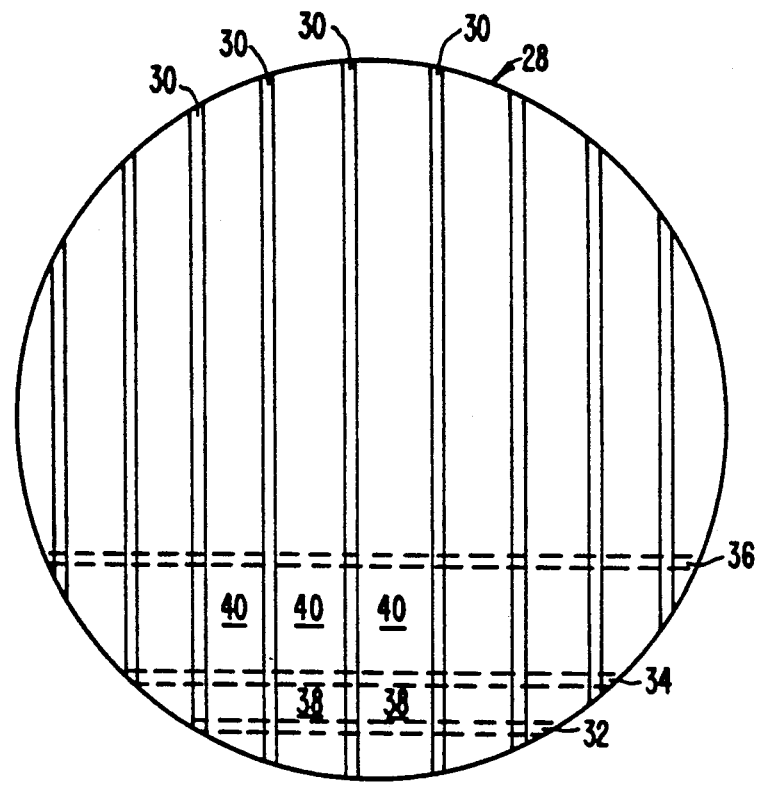
FIG._3.
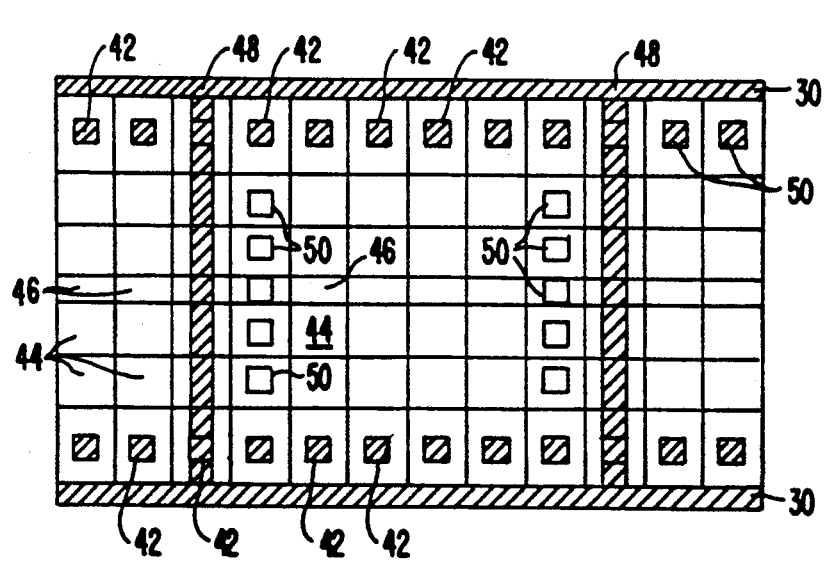
FIG._4.
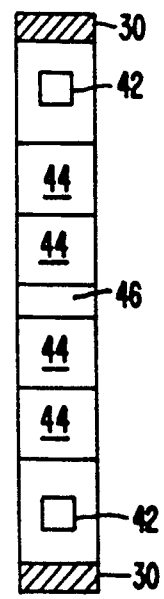
FIG._5.

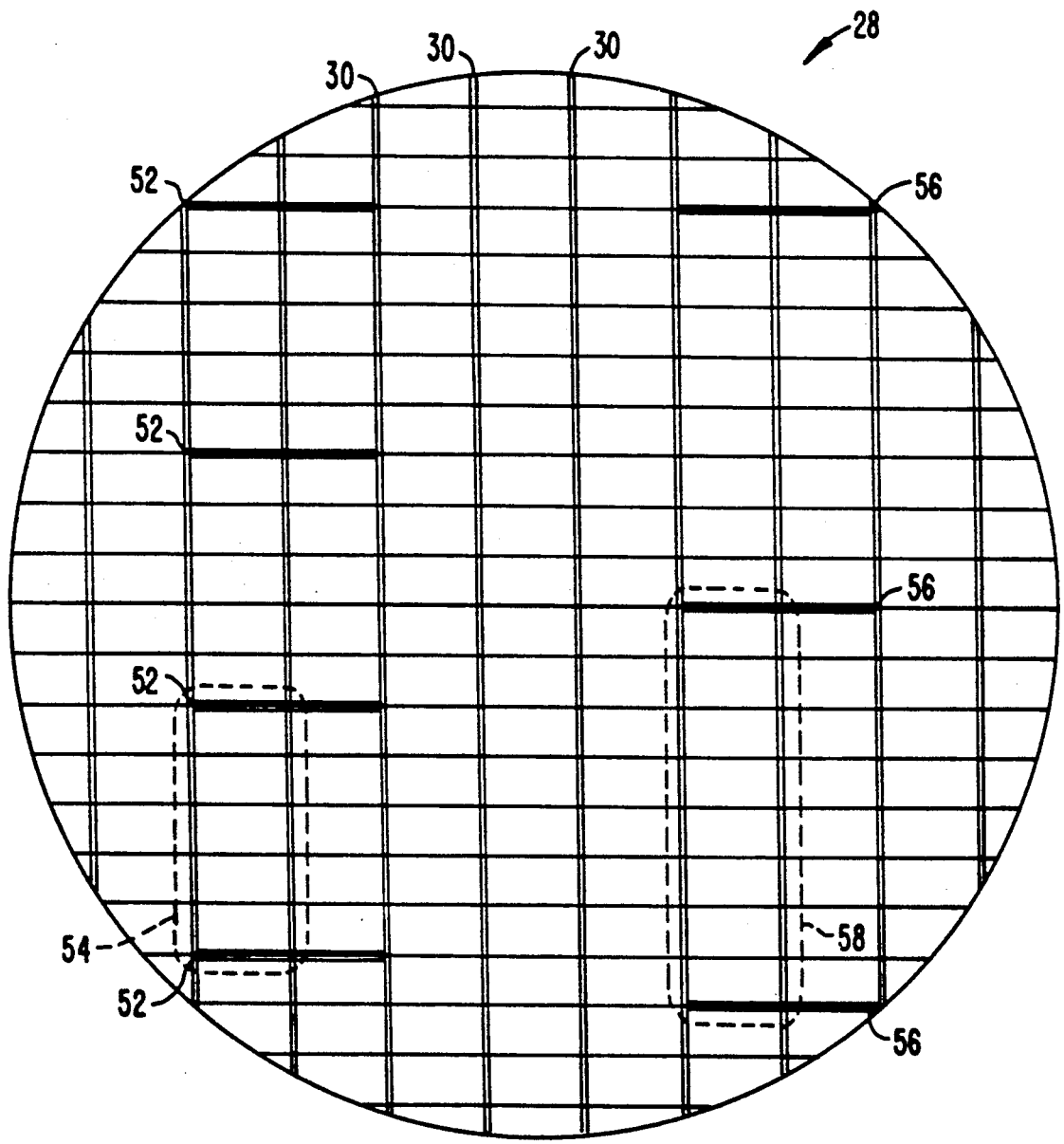
FIG._6.

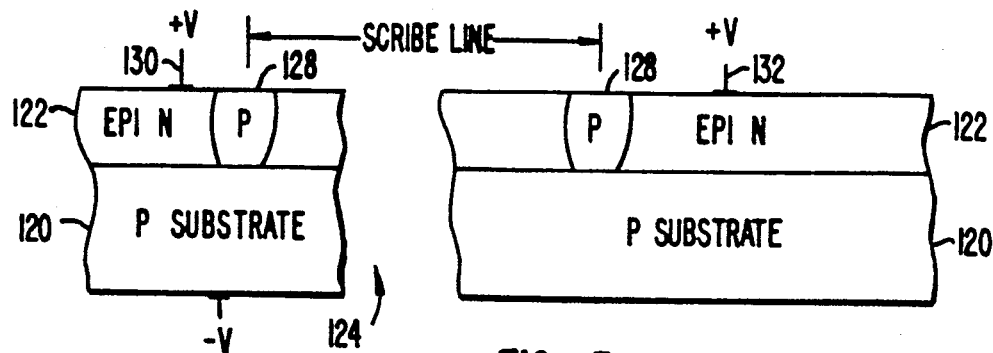
FIG._7. PRIOR ART
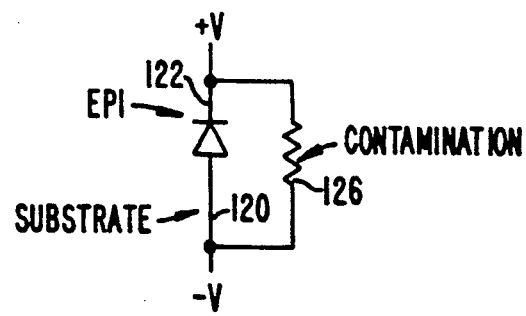
FIG._8.
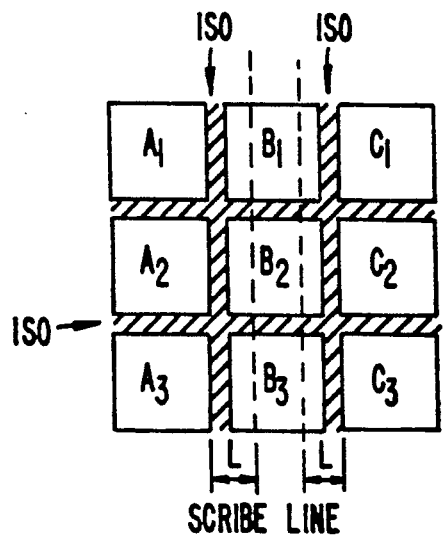
FIG._9.

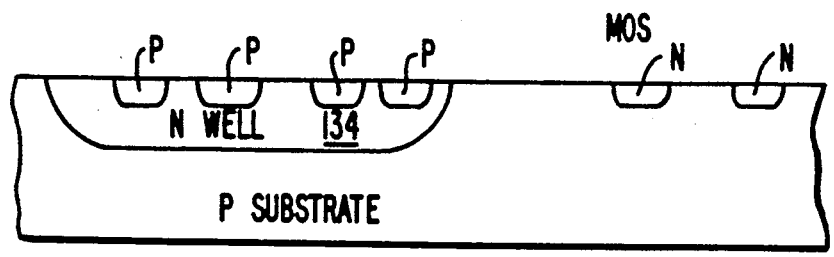
FIG._10.  PRIOR ART
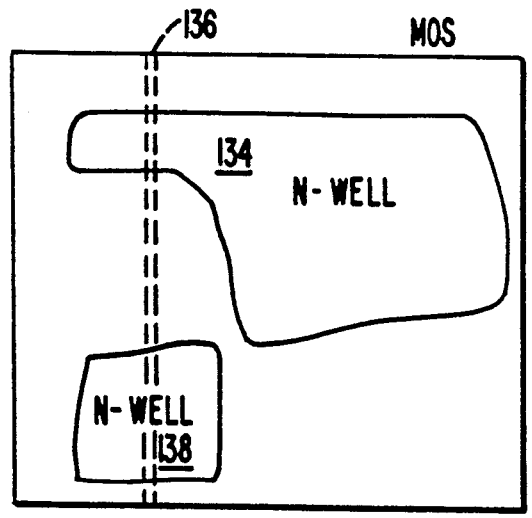
FIG._11.  PRIOR ART
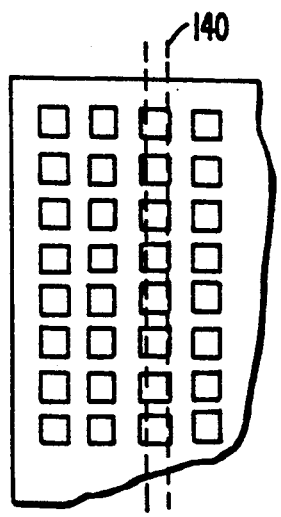
FIG._12.
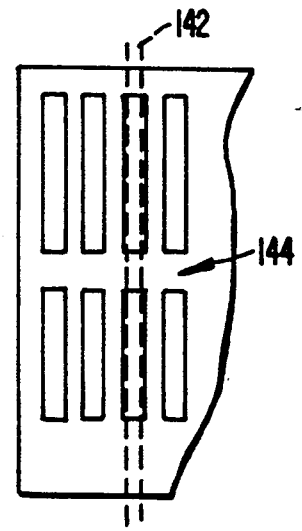
FIG._13.

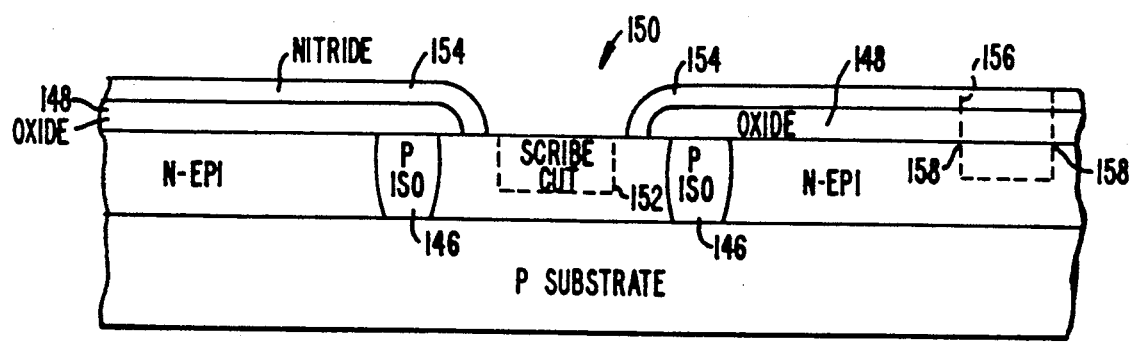
FIG._14. PRIOR ART
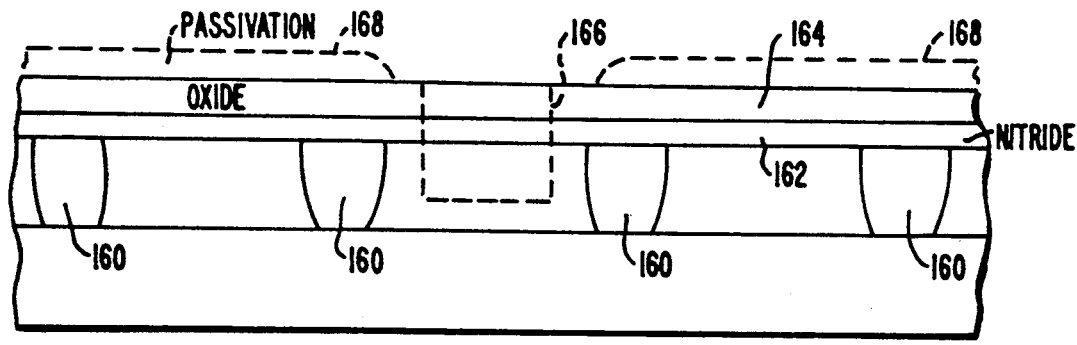
FIG._15.

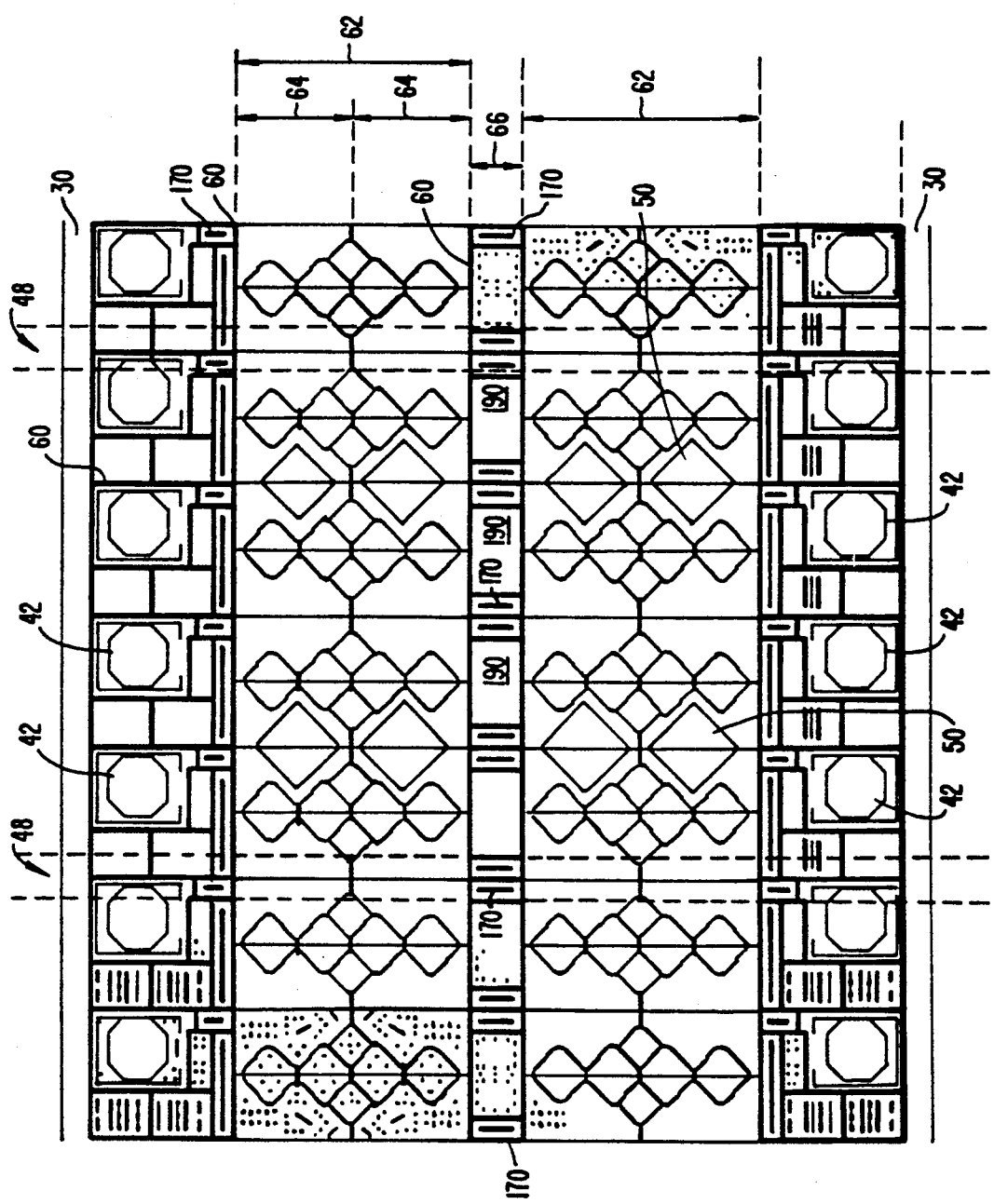
FIG._16.

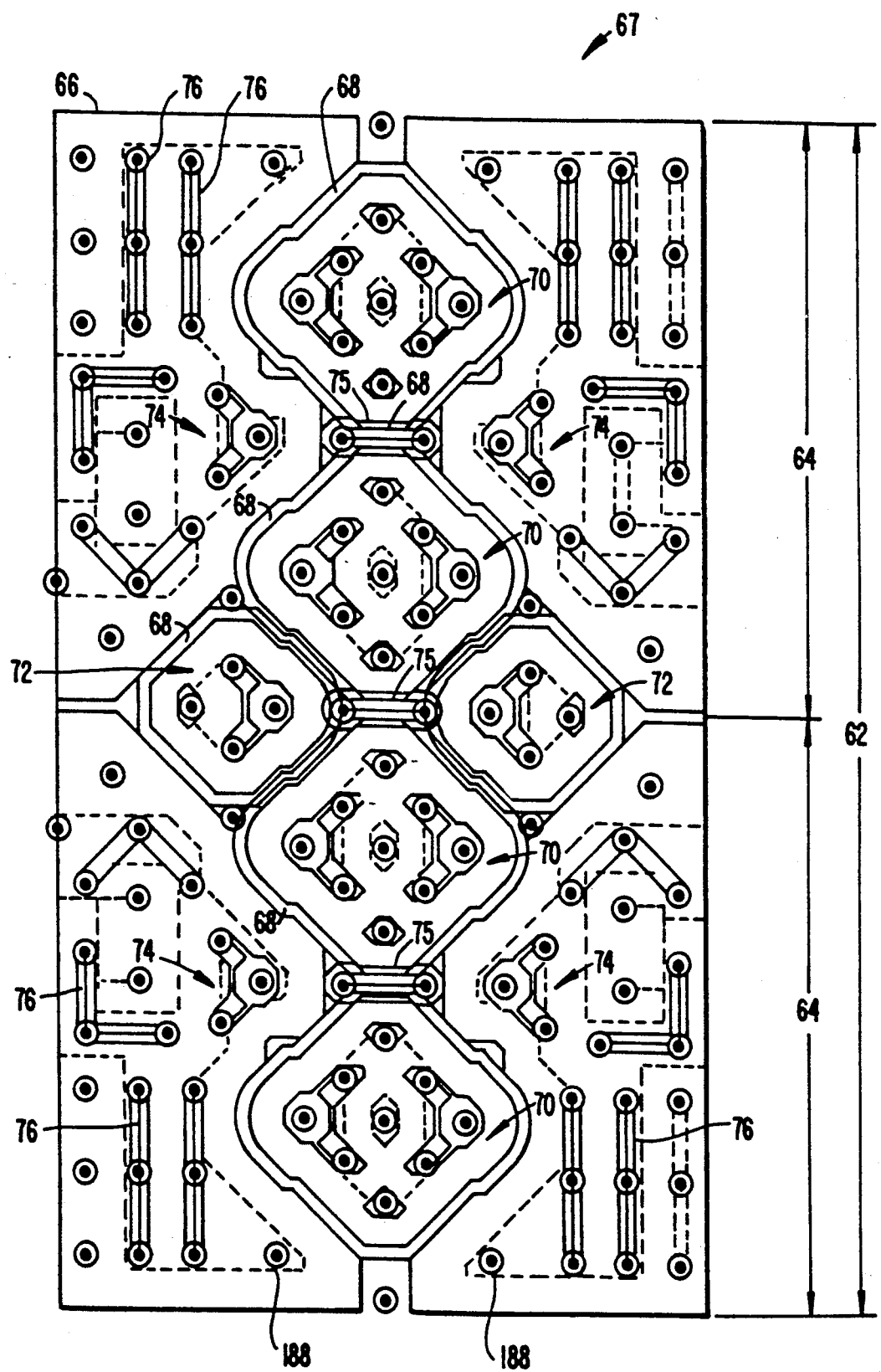
FIG._17.

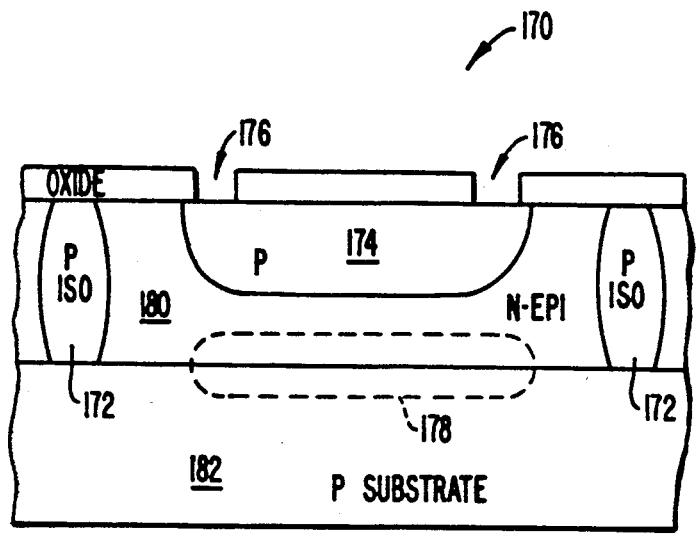
FIG._18.
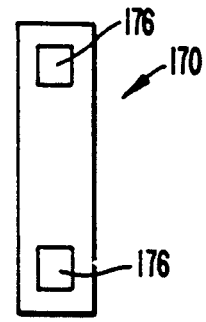
FIG._19.
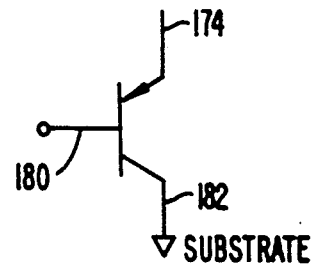
FIG._20.
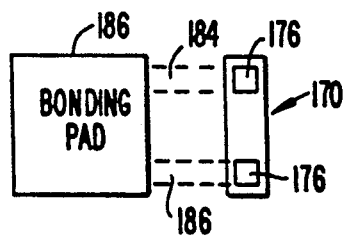
FIG._21.

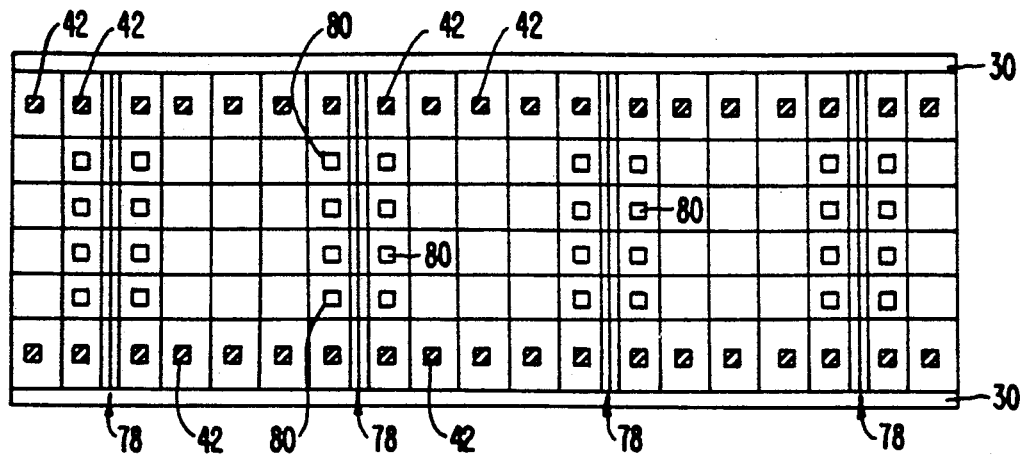
FIG._22.
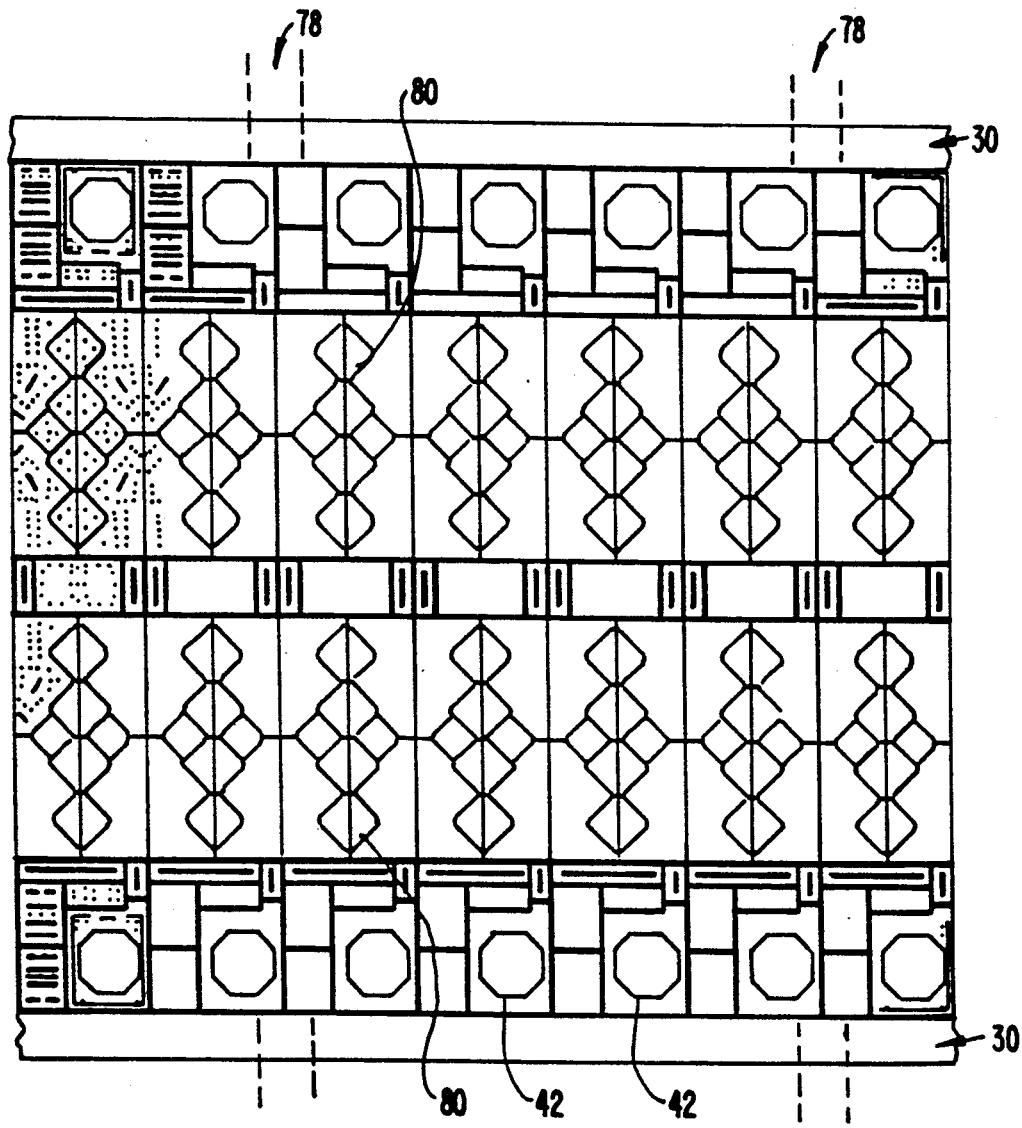
FIG._23.

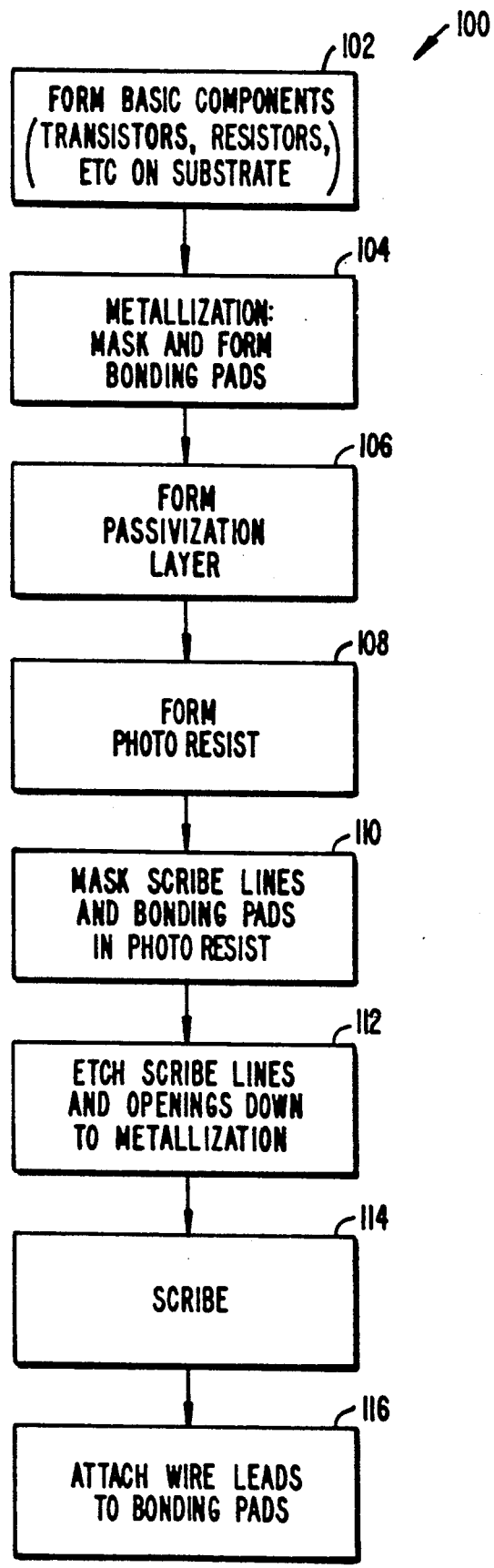
FIG._24.

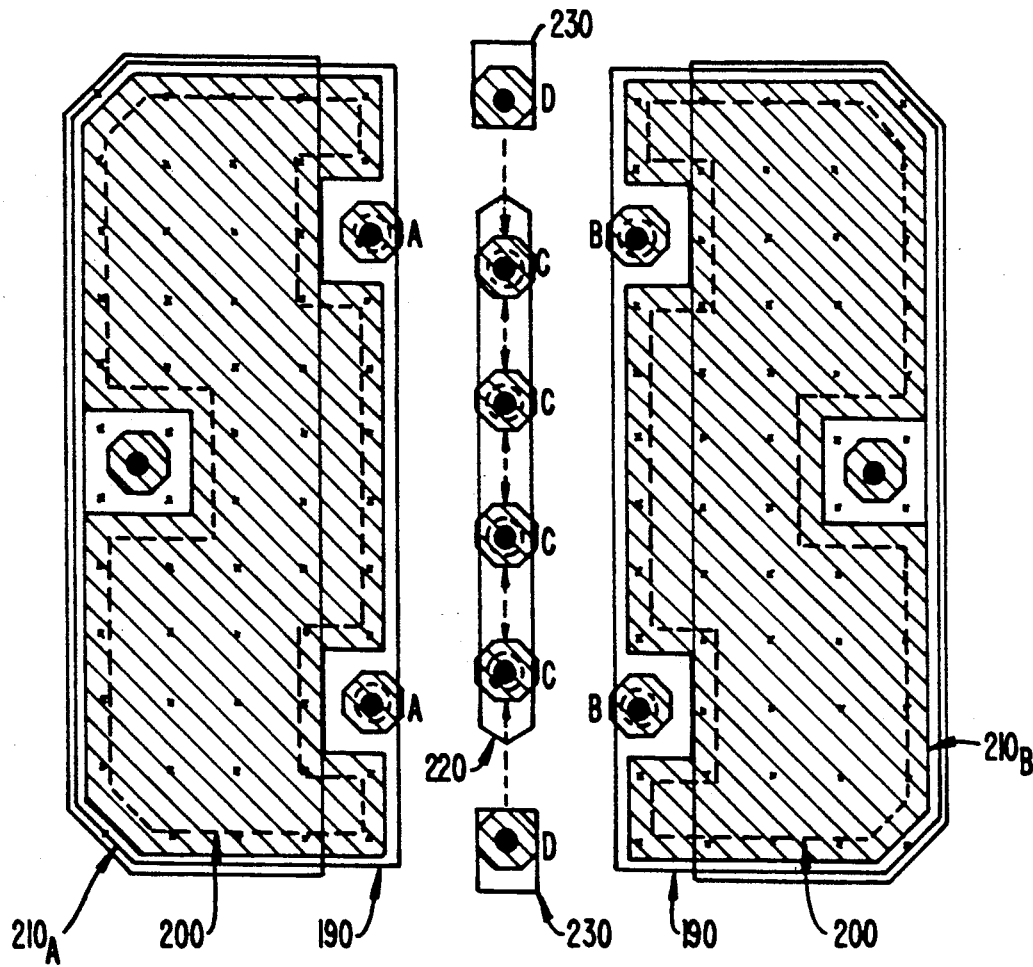
FIG._25.
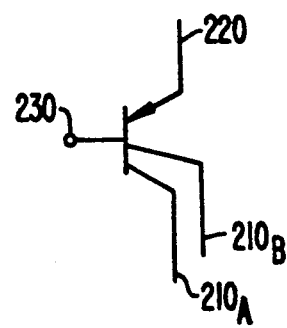
FIG._26.

PROGRAMMABLE DIE SIZE CONTINUOUS ARRAY

This is a continuation-in-part of application Ser. No. 07/255,094, filed Oct. 7, 1988 now abandoned.

BACKGROUND OF THE INVENTION

This invention relates to fabrication techniques for semi-custom integrated circuit arrays and the chips produced thereby. In particular, the invention relates to the placement of scribe lines.

The following publications are representative of the state-of-the-art for making semi-custom IC's as known to Applicant.

"The Flexible Array Technique: A Revolutionary Custom Bipolar Approach", Journal of Semi-Customs IC's, Vol. 4, No. 3, 1987, G. Gianella, discusses the shortcomings of existing linear semi-custom techniques and discloses a flexible array semi-custom technique featuring three key concepts: the use of multi-functional components called mutants; the use of an efficient universal cell; and lower silicon and design costs.

"Switch Design for Soft Configurable VLSI Systems", 1985 Chapel Hill Conference on VLSI, by Katvenis and Blatt, discloses general wafer lay out considerations, including the location of bonding pads and busses on a wafer.

"Design of VLSI Gate Array IC's", by Ernest E. Hollis, lecturer state-of-the art program, Northeastern University, pages 6-37, 1986 discusses the general principles of gate array fabrication.

"Structure of Semi-custom Integrated Circuits", by Hicks, Chapter 4, Short Run Press (England), 1983, discusses semi-custom integrated circuits including the types of semi-custom integrated circuits, fabrication steps, and layout techniques (including cell structures). A block cell structure having spaced apart cells is disclosed, see paragraph 4.2.2, wherein the spaces between the cells are used for routing inter-connections between the cells.

"Semi-custom IC Design and VLSI", edited by P. J. Hicks, Chapter 2, discusses the advantages and disadvantages of using cells in semi-custom design and fabrication.

"Gate Array Design Techniques and Applications", John W. Reid, McGraw-Hill, 1985, pages 7-9 and Chapters 3 and 9, discusses semi-custom IC fabrication technologies, including advanced cell designs (e.g., FIG. 9.3).

"A Forty K Equivalent Gate CMOS Standard Cell Chip", by Alredge, et al., IEEE 1987, Custom Integrated Circuit Conference, describes the features of a CMOS standard cell chip.

"A CMOS Master Slice Chip of Versatile Design Features", by Sporck, et al., 1984, IEEE, discusses cell arrays and a CMOS logic chip having a buffered logic cell.

"Structured Arrays—The Next Generation Gate Arrays", Svein O. Davidsen, Proceedings of the 1984 Custom Integrated Circuits Conference, May 21-23, Electron Devices Society of the IEEE, discusses structured arrays which combine the features of the gate array and standard cell approaches for application specific integrated circuits.

"Extending the Gate Array Concept Through Standard Cells", R. C. Laird, Journal of Semi-custom IC's, Vol, 4, No. 2, 1986, discusses requirements and advantages for using standard cell technology.

The following are prior art patents known to Applicant relating to making custom and semi-custom IC's.

Aneha, et al., U.S. Pat. No. 4,701,778, "Semiconductor Integrated Circuit Having Overlapping Circuit Cells", discloses the use of overlapped cells to increase packing density in a logic LSI circuit.

Kolwicz U.S. Pat. No. 4,633,571, "Method of Manufacturing a CMOS Cell Array with Transistor Isolation", discloses the use of transistor isolation and standard cells.

Sharma, et al. U.S. Pat. No. 4,575,745, "Tailorable Standard Cells and Method for Tailoring the Performance of IC Designs", discloses techniques for optimizing power consumption and IC array by providing independent control over the width of power busses and the size of active devices within cells in the IC array.

Angleton, et al. U.S. Pat. No. 4,724,531, "Gate ARray with Bi-directional Symmetry", teaches that logic functions are more easily implemented by disposing core cells within the gate array with mirror symmetry in two orthogonal directions.

Wong et al. U.S. Pat. No. 4,554,640, "Programmable Array Logic with Shared Product Terms", discloses a specific AND/OR gate circuit arrangement.

Kavlan U.S. Pat. No. 4,422,072, "Field Programmable Logic Array Circuit", discloses a technique of programmably enabling certain device pins to switch between functioning as data output pins and data input pins.

As evidenced by the foregoing references, the integrated circuit industry in general and the semi-custom industry in particular place a premium on expediting array development time and reducing associated tooling and material costs. To accomplish these goals, semi-custom chips are used. Basic components such as transistors, resistors, and capacitors are diffused ahead of time onto wafers at fixed locations, in patterns and with fixed numbers. An end user implements his custom product by designing a special metallization mask connecting only the components required for his application. Usually only one or two metal masks are required.

Such conventional semi-custom approaches provide a number of advantages: first, only one or two masks and one or two diffusion steps are required to complete the wafers, making such semi-custom techniques faster and cheaper than a conventional full scale integrated circuit development effort where 8 to 14 masks and diffusion steps are required for turn around.

Nevertheless, a basic problem remains in that the semi-custom die will rarely match the number and mix of components actually needed by the customer. As a result, quite frequently a number of components of the die will remain unused which means that silicon will be wasted. The semi-custom industry has responded to this problem by offering a family of arrays with different die sizes and consequently different component counts. However, because it is expensive to develop mask sets and special tooling for each different die size and because it is expensive to maintain an inventory of each die size, the number of different die sizes available is limited. For example, for bipolar semi-custom arrays, dies have 66, 99, 180, 240 and 360 transistors are available. For CMOS gate arrays, dies having 540, 864, 1188, 1932, 2592, 3240, etc., transistors are available. In most cases then, the user has to use an array containing more components than actually required because a smaller array is either not available or will not work. As an example, in an application requiring 250 transistor per die, an array with 360 transistors (and consequently a much bigger silicon area) must be used. Unfortunately, this mis-match between the needed component count and the available component count sometimes leads medium and high volume production and users to abandon semi-custom vendors and adopt custom, in-house fabrication.

Considering the high number of different components, like small, medium and power NPN or PNP transistors, resistors of low, medium and high value, capacitors and bonding pads, the chances of having the right number and mix of basic components in a given semi-custom array are minimal. Accordingly, prior art arrays force the use of devices big enough to contain the most critical components in the quantities required by the specific application.

The semiconductor houses, for tooling and inventory cost, offer a limited number of arrays. The possible choices of different breakdown voltages, speed, special components, different mix between components, and optional digital sections already require several different category of arrays, each one dedicated to a particular function. So it is too expensive and cumbersome to also offer a wide choice in total component count or die size in the same category of array. It is very common that a user has to use an array having many more components than he needs, because smaller arrays are not available. In many cases only one or two arrays per family are available.

The fixed mix between NPN and PNP transistors will be different from what is actually required by a customer and their location many times is not the best for routing. They do not allow a 100% utilization of all the components. Semi-custom components are larger than their full-custom counterparts. This is due to routing requirements a much more difficult and time consuming task in a semi-custom solution because of the fixed position of all the components. The transistors have multiple collector contacts, sometimes dual base contacts, base-emitter contacts far enough apart to allow a metalization line between the two and similar techniques to facilitate the metal interconnections. In a full custom design, instead, the components can be placed in the best positions for routing requirements.

All this translates into components about two times bigger, or in a high redundancy of some other form, such as resistors, cross-unders, etc. But still it is very difficult to reach a silicon utilization above 85-90%, while 75% is a more common achievement. Naturally, by using a dual metal layer this number can be increased, but this is at the expense of wafer cost and the turn-around time.

Thus there is a need to provide arrays such that the difference between the components needed by the end user and the components offered in an array or die is a minimum. Likewise there is a need to reduce the amount and variety of die sizes in inventory. There is also a need for such an array that is nevertheless prefabricated as close to finish as possible depending only on how large the custom die size must be. There is also a need for a method and system for forming a semi-custom array that uses a minimum number of masks and special tooling.

SUMMARY OF THE INVENTION

The present invention covers a semiconductor wafer for semi-custom use in which there are no scribe lines in at least one direction. Electrically isolated cells are provided throughout the wafer. The scribe lines can thus be arbitrarily placed according to an individual customer's instructions, with the isolated cells near the scribe line being covered with metalization to form a bonding pad.

The isolated cells are arranged in rows and columns so that no matter where the scribe line is placed only one or two rows or columns of cells will be cut. The isolation prevents conduction paths caused by contamination on the exposed edges from spreading beyond the cells through which the scribe line is cut. In addition, a nitride layer is deposited below the oxide layer so that when the cut is made, there is no contamination migration through an oxide/n-epi junction. This requires that a saw be used for cutting the scribe line, since a nitride layer cannot be cut by the scribe needles of the prior art.

Preferably, scribe lines are provided in one direction, either horizontal or vertical. This allows fixed bonding pads to be placed near these scribe lines and allows special components, such as power transistors and ESD protection systems to be placed near the fixed bonding pads. This provides better silicon efficiency than the embodiment with no fixed scribe lines by simplifying the routing. The components which need to be near the bonding pads are placed there, rather than being located randomly throughout the wafer. The customer can then specify a length of a cell which has a fixed height.

Thus, the customer can specify exactly the chip size needed, and thus avoids wasting silicon as in the prior art.

The user is only required to use a metal mask and a subsequent passivation mask to form the final IC product.

In one preferred embodiment, columns of repeating cells have a width that is greater than the width of a scribe line to minimize wasted silicon and contain isolated cell areas having a cross-sectional area at least as large as a bonding pad.

A preferred cell pattern uses horizontal scribe lines defining rows of cells. There are two rows of cells between each of the scribe lines. In between each of the two rows of cells is an intermediate, thin region which is available for routing purposes. For analog applications, the intermediate thin region can be used for capacitors, since it is electrically isolated from the other cells. Each cell preferably contains four vertically arranged transistor regions with two additional, smaller transistor regions near the center of the cell. Around the perimeter are located resistors and other devices, including miscellaneous transistors. Since the various regions are isolated from one another, any can be used for a bonding pad area.

Additional objects, features, and advantages of the invention will become more readily apparent by reference to the following brief description, the detailed description, and the appended claims.

BRIEF DESCRIPTION OF THE DRAWINGS

FIG. 1 is a diagram of a prior art wafer showing scribe lines in both directions;

FIG. 2 is a diagram of a single die of the prior art from the wafer of FIG. 1;

FIG. 3 is a diagram of a wafer according to the present invention having scribe lines in only one direction;

FIG. 4 is a diagram of a die according to the present invention, showing placement of bonding pads in cells adjacent the scribe line;

FIG. 5 is a diagram of one column of cells between the horizontal scribe lines of FIG. 4;

FIG. 6 is a diagram of a wafer according to the present invention showing different placements of scribe lines to result in different size chips;

FIG. 7 is a side view of a prior art scribe line area;

FIG. 8 is a circuit diagram showing the diode biasing and contamination conduction path which can be caused by scribe line cut;

FIG. 9 is a diagram showing the isolated cells of the present invention containing a scribe line;

FIG. 10 is a diagram of a side view of a prior art MOS circuit;

FIG. 11 is a top view of a prior art MOS circuit;

FIG. 12 is a top view of a first embodiment of an MOS circuit using an array of n-wells according to the present invention;

FIG. 13 is a diagram of an alternate embodiment of the present invention using elongate n-well regions in the direction of the programmable scribe line;

FIG. 14 is a diagram of a prior art scribe line area showing the nitride layer isolation;

FIG. 15 is a side view of the present invention showing the placement of the nitride layer;

FIG. 16 is a detailed diagram of an array according to the present invention showing the placement of scribe lines and bonding pads in cells adjacent the scribe lines;

FIG. 17 is a diagram of a single cell of FIG. 16;

FIG. 18 is a side view of an electrostatic protection device according to the present invention;

FIG. 19 is a top view of the device of FIG. 18;

FIG. 20 is an electrical diagram of the vertical PNP transistor of FIG. 18;

FIG. 21 is a diagram showing the connection of a bonding pad to the ESD of FIG. 18;

FIG. 22 is a diagram of an array according to the present invention showing scribe lines being selected and bonding pads being placed in the same cells as the scribe lines;

FIG. 23 is a diagram showing one die from FIG. 9 in more detail;

FIG. 24 is a flow diagram of a method for forming an integrated circuit according to the invention;

FIG. 25 is a detailed diagram of a portion of the routing region of FIG. 16; and FIG. 26 is a circuit diagram of the region of FIG. 25 connected as a dual collector PNP transistor.

DETAILED DESCRIPTION

The invention will now be explained by first describing the prior art. FIG. 1 shows a prior art semiconductor wafer 12 having a number of vertical scribe lines 14 and horizontal scribe lines 16 defining a plurality of dies for semiconductor chips 18. As can be seen, each wafer contains dies of a specified size, and thus the user has to pick a size larger than what is needed for the user's particular circuit. Thus, extra components in a particular die 18 will be wasted.

FIG. 2 shows a chip 18 of FIG. 1 with the concept of the programmable scribe lines and bonding pads of the present invention shown in phantom. The chip is defined by the boundaries of scribe lines 14 and 16. A number of bonding pads 20 are located around the periphery of the chip. The chip includes in its interior a number of circuit elements 22, which could be transistors, resistors, capacitors, etc. For a particular user, a circuit desired may need no more components than those to the right side of a phantom scribe line 24. Thus, the components to the left of phantom scribe 24 would be wasted, since they are not needed by the customer's particular application. If a scribe line were cut in position 24, it would be desirable for the customer to have a bonding pad placed in a position such as shown in phantom in area 26. However, placement of metalization in this area would obviously cause electrical leakage and other problems because of its placement over underlying components which are not isolated. For these reasons, the entire chip is used with the fixed scribe lines and the wasted silicon is tolerated.

FIG. 3 shows a wafer 28 according to the present invention which has only fixed vertical scribe lines 30. As can be seen, different chip sizes can be selected by the placement of horizontal scribe lines 32, 34 and 36 shown in phantom. First cells 38 of a small size would be created between scribe lines 32 and 34. Second cells 40 of a larger size would be created between scribe lines 34 and 36. Thus, a customer can select a chip size which exactly fits the customer's needs.

FIG. 4 shows a portion of the area between two scribe lines 30 of FIG. 3. Next to the fixed scribe line 30, there are fixed bonding pads 42. Between the fixed scribe lines 30, there are rows of cells arranged in column. Such a column is shown in more detail in FIG. 5. There are four identical cells 44, and intermediate, smaller cells 46. As can be seen in FIG. 4, a pair of scribe lines 48 specified by a customer determine the chip size. The scribe lines go through one column of cells, making those cells unusable. The cell width is made to be only slightly larger than the area required by a scribe line, thus minimizing the amount of circuitry made useless by the scribe line. The column of cells immediately adjacent scribe lines 48 are used for bonding pads. A number of these bonding pads 50 are shown in FIG. 4. Each cell is electrically isolated from the other cells by an isolation region. Thus, when the metal of a bonding pad is placed over a cell, there will be no interference with adjacent cells. The size of the cells is chosen not only to correspond to the width of a scribe line, but also to correspond to the area necessary for a bonding pad.

As previously mentioned, the top and bottom of the array may include pre-formed bonding pads and scribe lines. According to this embodiment, the array in the vertical direction is similar to present arrays which have an internal core of components and a periphery that includes bonding pads and scribe lines. However, the array according to the invention is significant in several respects. First, in the horizontal direction bonding pads and scribe lines are not assigned or defined. Rather the user determines the number of basic cells required in his application and then inscribes scribe lines and inserts bonding pads to meet the determined need. In addition, the array includes self-isolated cells wherein the transistor and resistor components are isolated within each individual cell.

It can be seen that each cell should have a width approximately the same as the scribe line to minimize the amount of wasted silicon. Conventional scribe lines known to applicant have a width of approximately 50-75 microns. In addition, where each cell is to have the capability of receiving a bonding pad, it would be desirable for each cell to have a cross-sectional area at least as large as a bonding pad. For conventional semicustom integrated circuits, this would be a size of approximately 100 microns by 100 microns.

A typical cell will have a horizontal dimension of between 150 and 250 microns. Horizontal dimensions below 150 microns are not allowed for bonding requirements because 150 microns is approximately the minimum distance between bonding pads using technology known to applicant. Where the array exceeds 250 microns in the horizontal dimension, the number of available bonding pads become too low.

As can also be seen for the embodiment in FIG. 4, the number of columns required for the integrated circuit will be the total number of columns required for giving the needed amount of cells, plus two cells for the bonding pads and one for scribing. Thus in general, the horizontal size will be determined by the number of cells, required plus three columns of cells. In a practical case, for a semi-custom linear array, the number of cells will be between 5 and 40.

FIG. 6 again shows wafer 28 of FIG. 3 according to the present invention with fixed vertical scribe lines 30. On the left side of the wafer, scribe lines 52 are shown which define a chip size, or die, corresponding to 5 rows of cells for a chip 54. On the right side, customer selected scribe lines 56 define an 8 row die 58. In practice, all of the die on a single wafer would be the same size, since a user will typically require at least the number of chips on a single wafer. Also, the fixed vertical scribe lines 30 could be horizontal, with the variable scribe lines selected by the user being vertical. In still another alternate embodiment, no fixed scribe lines could be provided at all, with the individual user selecting both the horizontal and vertical positions of the scribe lines.

The arbitrary placement of a scribe line is possible because the cell structure of the invention will isolate the scribe line no matter where it is placed. The need for such isolation is another reason fixed scribe areas are used in the prior art.

Bipolar

In bipolar ICs, we have a substrate 120, p or n, and an epitaxial layer 122 of opposite polarity (see FIG. 7 where the most common case of substrate of p is used).

The epitaxial area contains isolated areas where transistors are diffused and other areas containing passive components such as resistors, etc. The epitaxial/substrate junction forms a diode as shown in FIG. 8. In both regions the epitaxial is connected to a potential higher than the substrate, to prevent electrical conduction through the diode formed by the epi and the substrate. After the scribing or sawing of the wafer and consequent breaking, the n-p junction remains exposed in an area 124 (see FIG. 7). This junction not only has been subjected to a great mechanical stress during the sawing or scribing and separation, but because it is exposed, it will be subjected to all kinds of contamination from moisture and particles in the air. Consequently, the junction is no longer a pure junction, but it will have a conductive path 126 formed by the contaminants in parallel to the diode (see FIG. 8). This means that, if as usual, we apply a positive voltage to the epi in comparison to the substrate, we have an unwanted leakage current between epi and substrate.

The value of this current will change in time and case by case. This is the reason why in prior art bipolar wafers, the area designated for the scribe line is completely isolated by isolation diffusion areas 128 (FIG. 7) from the rest of the circuit and no voltage is offered in this area.

As we can see, the positive bias applied at points 130, 132 cannot generate any leakage because of the presence of the isolation diffusions. This means we need to know in advance where the scribe line will be located and any programmable, continuous die size concept will not be possible.

The present invention avoids this problem by subdividing the IC into small, isolated islands each containing active or passive components (see FIG. 9). This means the separation of the wafers in dice will generate potential leakage problems in well defined, localized regions. But, only these regions cannot be used, the next ones can be used safely because they are isolated by the isolation perimeters around the cells from the affected ones.

After separation, the islands B1, B2, B3 cannot be used, while A and C islands are completely separated from the leaking junctions by the isolation regions.

It is also clear that it is important that the islands cannot be too much bigger than the scribe line, generally 50–100 microns, otherwise we lose too much silicon. Also, to avoid potential contamination on the surface going from the edge of the scribe to the next islands and to avoid having that same mechanical stress during the scribing, separation and sawing affect the electrical characteristics of the neighboring components, it is a good rule to leave about 50 more microns on each side of the scribe lines (L=50 microns). This means that the minimum size required is between 150 and 200 microns. In our implementation, it is 216 microns.

Naturally, if the islands are much smaller, suppose 50 microns each 3 or 4 islands must be sacrificed for the scribe line. In this case, the B islands will be entirely mechanically destroyed during the separation and the A and C islands cannot be used because of mechanical stress and potential contaminations.

MOS

The same technique can be transferred to CMOS arrays using a similar principle. In this technology, large diffusions are used to isolate MOS of one polarity from MOS of the opposite polarity. When a P substrate is used, large n-well diffusions are used to isolate the pMOS inside the well from the nMOS outside. Such an n-well is shown in a side view in FIG. 10 and a top view in FIG. 11. The n-well is biased to a positive potential, so the n-p junction is reversed biased. If we want to use the concept of programmable die size, we need to avoid putting the scribe line where the n-wells are located, otherwise we have leakage problems as in the bipolar ICs. As can be seen, a phantom scribe line 136 of FIG. 11 would ruin the entire n-well 134, as well as n-well 138.

The solution of the present invention is to subdivide the n-well regions into smaller islands in such a way that only the n-well areas affected by the scribe line cannot be utilized, but the n-well regions that are far away (at least 50 microns from the scribe line) can be used without problems. Thus, in FIG. 12, only the n-wells in the row under scribe line 140 would be unusable.

Another possible solution is to use long strips of n-well separated by the substrate as shown in FIG. 13.

In this case, the scribe line 142 can be located on top of an n-well or between two n-wells. If the area is not wide enough (50–76 u) for a standard scribe line, an n-well and the adjacent P substrate region can be used. For very advanced processes where the n-wells can be very small, more n-well and p regions could be required to allocate the scribe line. Naturally, all this applies to the opposite case when an N substrate is used and the well is a p polarity. A fixed scribe line area 144 can be provided in a direction perpendicular to the variable scribe line.

Equally, the concept can be extended to BICMOS processes where bipolar and CMOS processes are diffused in the same wafer. The concept of programmable scribe line can be used in subdividing the wafer into small cells or tiles, each one isolated from the next one using the above techniques already described for bipolar or CMOS devices.

Yet another reason arbitrary scribe line placement was not possible in the prior art is because moisture would cause contamination at the oxide epitaxial junction when the scribe cut is made. With a fixed position for the scribe line, this is avoided by using a nitride layer as shown in FIG. 14. Two isolation regions 146 prevent a contamination conduction path at the end of the n-p substrate boundary as discussed previously. An opening in oxide layer 148 is maintained over the scribe line area 150. The scribe cut itself occurs in area 152. By placing a nitride layer 154 over the oxide layer, there is no exposed oxide/n-epi junction.

If, instead, a scribe cut was done at a position 156, as shown in phantom, it can be seen that after the cut the oxide/n-epi junction would be exposed at points 158. The contamination would creep along this junction and would pass over the isolation region 146. Thus, both the placement of the scribe cut within the isolation region and the use of a nitride layer to seal the oxide/n-epi junction is needed to prevent contamination and eventual decaying of components over time as a result of the scribe cut. Other materials with properties similar to nitride could also be used. Such other materials would need to act as an electrical insulator and not interact with silicon when exposed to water.

FIG. 15 is a side view of a wafer according to the present invention showing the periodic cells with their periodic isolation regions 160 which allow the arbitrary placement of the scribe line in any row or column of cells. The scribe line is thus isolated and contamination is limited to particular cells in which the scribe cut is placed. In addition, during the formation of the wafer, a nitride layer 162 is deposited beneath an oxide layer 164. Thus, no matter where the scribe cut 166 is placed, there will be no oxide/n-epi junction which would be subject to contamination.

This structure requires an additional change in the scribing process. As can be seen, there is no fixed opening through the oxide and nitride as in the prior art. A conventional scribing needle needs such an opening because it would slip on the oxide and would not be able to cut through the nitride. Accordingly, the present invention requires a saw so that there will be no slippage on the oxide layer and there is an ability to cut through the hard nitride layer. A saw with diamond powder on its edges is preferably used.

Once it is determined where the scribe cut 166 will be placed, a passivation layer of silicon is placed on the wafer, leaving openings for the scribe cuts and the bonding pads. The passivation layer has a 75 micron opening for the scribe line, with the cut itself being approximately 30-40 microns. The passivation layer 168 serves to protect mechanically and electrically the surface of the wafer.

FIG. 16 provides more detail of the cells in the embodiment of FIG. 4. Fixed scribe lines 30 appear near the top and bottom of the array, with fixed bonding pads 42 being similarly placed. Wide dashed lines 48 indicate the location of the user selected scribe lines, and solid areas 50 show the user selected bonding pad areas. All the cells are isolated by isolation regions shown by dark lines 60.

As can be seen, between the top and bottom rows of cells including bonding pads 42, there are two identical rows of cells between the horizontal lines indicated by arrows 62. Each of these cells includes two sub-cells indicated by the lines between arrows 64. An intermediate row of cells is indicated by the lines between arrows 66. The area of the cells between arrows 66 can be used for routing metal interconnecting lines for digital circuits, or for providing capacitors in analog circuits. Since each cell in this row indicated by arrow 66 is isolated, the metalization of the capacitor can be placed over it without interfering with adjacent cells. In addition, when a customer only needs a small chip, an additional horizontal scribe line can be placed through row 66.

FIG. 17 shows a cell 67 defined by arrow 62 of FIG. 16. The cell is surrounded by an isolation region 66. Internal isolation regions are indicated by double lines defining isolation region 68. These internal isolation regions 68 define 4 isolated cell areas 70 in a column. Each cell area 70 can be used to form one or more transistors. Preferably, a cell area such as that disclosed in copending U.S. application Ser. No. 846,380, filed Mar. 31, 1986 is used. This allows either 2 NPN transistors with a common collector or a PNP transistor with two collectors.

A cell is divided into two equal sub-cells 64 for maximum efficiency. Between the two sub-cells are two spare transistor cells 72 which can be used when only one or two more transistors are required to complete a function. This saves the next cell for more efficient utilization. Depending on the complexity of the circuit to be implemented, one, two or more sub-cells will be used. In this way the utilization of the active components is done by small increments, only two transistors at a time. In the worst case, only one transistor will remain unused. In the prior art tile arrangement of arrays, each tile contains 10-15 transistors and the unused portion can be several times higher.

Each cell also contains two more transistors 74 in the same epitaxial island as resistors 76. The area occupied by transistors 74 is very small, about the size of a resistor, and they can be used as emitter followers, avoiding the use of the much bigger isolated transistors. The routing is also simplified because the collector can be automatically connected to the power supply. Crossunders 75 are provided to ease routing.

Cells are designed to be universal so that they can be used for both analog and digital application. One cell can be a simple operational amplifier and two cells can make a 741 style operational amplifier. The basic cell can be split into two sub-cells, each forming the basic building block of any analog design: a differential pair with its own current source. In digital applications, a cell can make four gates, using dual inputs with an emitter follower in the output or using a cascaded emitter coupled logic where one cell can be a D-type flipflop.

As can be seen by referring back to FIG. 16, the epitaxial island in which resistor 76 and transistor 74 appear are used for bonding pads. These areas are isolated from the transistor cells by isolation region 68. Similarly, transistor areas 70 could be used for bonding pads for the embodiment shown in FIGS. 22 and 23. Again, isolation region 68 will isolate the bonding pads from transistor 74 and resistor 76.

The epitaxial islands outside of transistor cells 70 and 72 preferably contain a matched NPN pair of transistors. This can be used as an input stage, or as an output driver. Three wide implanted resistors are also included in this area, to be used when matching better than 1% is required. A Shottky diode is included for high speed applications. Finally, a variety of high and low value resistors are included.

The cell has a double symmetry. That means the layout is the same if the user, implementing a circuit, starts from left to right or vice versa. The same applies for top and bottom. This greatly simplifies the layout phase, the required software and the creation of a soft cell library.

The basic cell is repeated across the array. This layout permits efficient utilization of a soft macro library. These macros have a fixed height, with the length varying according to the number of cells used. This brings the benefits of the standard cell approach to the linear world without sacrificing the advantage of semi-custom, fast turn around and low tooling cost.

Digital applications require much higher routing capability than the linear applications. While the cross-unders inside and between cells are enough to connect components or contiguous cells, a routing channel for power supply lines and signal lines placed between two rows of cells allow connection capability between two cells far away.

The routing channel of cells 66 occupies a significant silicon area and can be used in analog applications for customized oxide capacitors, where the value of the capacitor is a function of the metalized area. The thin oxide and one plate of the capacitor is always there, the user requiring a capacitor will need to draw a metal area proportional to the required value.

In applications where the user requires resistors of special values and low temperature coefficients, an optional step will deposit thin film resistors in this area.

In applications as D/A, A/D, precision reference and similar circuits where high precision ratios and low temperature coefficients are required, thin film resistors can be deposited in these areas and the zener diodes available in the bonding pad areas can be used for trimming purposes.

FIGS. 18 and 19 show side and top views, respectively, of active P cross-under regions 170. Referring to FIG. 16, fixed bonding pads 42 have their own electrostatic protection devices nearby. Because of the programmable nature of the present invention, the variable bonding pads do not have the same advantage of a fixed position with fixed electrostatic protection devices. To solve this need, active cross-under regions 170 are interspersed in pairs of two throughout the intermediate routing region 66. Cross-unders 170 also appear in the cell areas containing the fixed bonding pads near the perimeter of the cell array. Thus, no matter where the scribe line and programmable bonding pads are placed, there will be a cross-under region 170 nearby.

As can be seen in FIGS. 18 and 19, each cross-under is isolated by isolation regions 172 and contains a P diffusion 174 with contact openings 176. This device can thus be used as a routing cross-under to allow the connection under a metal connection passing between contacts 176. Normally, in the prior art, and in cross-unders used in other places in the array of the present invention, a buried layer 178, shown in phantom, is used to prevent the cross-under from acting as a vertical transistor. Such a vertical transistor would be formed with P region 174 acting as the emitter, n-epi region 180 acting as an open base, and P substrate 182 acting as the collector, as shown in FIG. 20. By eliminating the buried layer in the present invention, this vertical transistor can be used as an electrostatic protection device. A metal contact is formed from the bonding pad to the nearby cross-under 170, with contacts being formed at both positions 176 for maximum conduction. Such metal connections are shown as lines 184 from the bonding pad 186 in FIG. 21. Because many of these devices will not be used as a transistor, and instead as a normal cross-under, the isolation regions 172 isolate any parasitic transistor that may develop.

The n-epi region of the vertical transistor is not connected so the base is open and the transistor works in the BVCEO mode. This means that all the parasitic voltages, which are positive and have a voltage larger than BVCEO, will be limited to this value. Typically, BVCEO ranges from 20–60 volts. Thus, a high voltage pulse impinging on the bonding pad will be shunted to ground, at the substrate, through the vertical transistor.

In order to handle negative voltage pulses, as opposed to positive, a diode between the bonding pad and the substrate is provided. This diode is formed by the junction between the substrate and the epitaxial layer, and is provided by contacts such as contact 188 as shown in FIG. 17. Contacts 188 are placed throughout the cells and are adjacent to areas 170 so that they can easily be connected.

In FIG. 26 a portion of the routing region 60 of FIG. 16 is shown with more details. This area is used as a routing region for digital applications, where many more metal interconnections are required between different cells in comparison to analog applications. A new, multifunction component was introduced in this area to improve silicon utilization in analog applications, where extra routings are not required. It has two large P diffusions, 190, covered by a thin oxide layer, 200, so these areas can act as capacitors if a metal layer, 210, is placed on top of the oxide. One plate is the metal layer and the P layer is the other one. If capacitors are not required, thin film resistors can be placed on top of the oxide. A third P region, 220, diffused in the center of this component, increases greatly the flexibility of this component. This region can be the emitter of a lateral PNP, where the two large areas, 190, can be the collectors. Two N+ diffusions in the epitaxial layer, 230, are the base connections of this transistor. Finally, this device can be used as 3 cross-unders. Two formed by the two collectors and by the contacts A and B, respectively, and the third one by the emitter area with its C contacts. A circuit diagram of the area of FIG. 25 connected as a two collector PNP transistor is shown in FIG. 26.

FIG. 22 again shows a portion of array as shown in FIG. 4 with fixed scribe lines 30 and fixed bonding pads 42. Here, the user selects scribe lines 78 to be placed on the border between two columns of cells, not in the middle of the cells. This way, bonding pads 80 can be placed in the same cell through which the scribe line passes, thus reducing the number of columns of cells which are not usable, and increasing the number of usable columns of cells in the array. A die between two scribe lines 78 is shown in more detail in FIG. 23. As can be seen, the scribe lines 78 passes through the boundary between two cells. Bonding pads 80 are placed in one of transistor regions 70 shown in FIG. 23. Thus, only a single cell column is used for the scribe line and bonding pad in the embodiment of FIG. 23.

Refer now to FIG. 24, which is a flow diagram of a method 100 for forming a continuous array according to the invention. As shown in FIG. 24, the first step in the method includes forming the basic transistor, resistor and other circuit components (capacitors, inductors, etc.) on a substrate. This step may include the formation of P and N type regions in an N type EPI layer over a P substrate as is well known in the art. All of the basic cell components are formed inside isolation regions according to the invention. The components and isolation periphery may be formed using conventional integrated circuit technology. A nitride layer is deposited before the oxide layers over the n-epi.

The masks for the diffusions are formed using electron beam technology. The method of forming a pattern for a chip and then stepping it across a wafer is not sufficiently precise for the present invention. In the stepping method, some error in the alignment of the mask as it is stepped across the wafer is allowable because the area between masks is the dedicated scribe line area. Thus, the scribe line is sufficiently wide to allow for such variations due to the imprecise stepping of the mask. In the present invention, on the other hand, because a continuous cell array is used, the use of fixed scribe line areas to cover for alignment errors is not possible. In fact, one-half of a component may be in one cell on one side of a mask, with the other half of the component being on the other side. Thus, precision is necessary.

At the next step 104 a metallization layer is formed over the array using conventional metallization techniques. This step includes using a mask to form bonding pads over those cells that are to be dedicated as bonding pad areas. These pads will typically be located inside the cells that are to be scribed to determined the die size. In the next step 106 a passivation layer is formed over the metallization layer using conventional integrated circuit techniques. In the next step 108 a photoresist is formed over the passivation layer using conventional integrated circuit fabrication techniques.

At the next step 110 the location of the scribe lines and the openings over the bonding pads are determined by masking the photoresist. The scribe lines will be located to provide the desired number of cells in the die area. The bonding pad openings will be located over the bonding pads that were formed during the metallization step.

In the next step 112 the scribe lines and openings over the bonding pads will be etched down to the metallization layer using convention etching techniques. In step 114, the scribe lines will be scribed into the integrated circuit down to the substrate level using a diamond edge saw. Step 116, which completes fabrication of the integrated circuit, includes attaching wire leads to the bonding pads in the integrated circuit.

This invention allows the customer to use a semi-custom die size very close in area (and cost) to a full-custom solution, but still using only two custom masks instead of the usual 10-15 required by a full custom solution. In addition, prior art techniques have required the maintenance of at least three different die size inventories. Three sets of special tooling, which is required roughly in parallel with the number of custom masks, would be needed. According to the invention, only one continuous array inventory, one custom mask, and one set of special tooling is required by the end user.

The invention has been discussed in reference to the illustrated embodiments. However it should be understood that many changes and variations in cell configuration, array lay out, and the types of components included in each cell can be used without departing from the scope and spirit of the invention. For example, although the cells are shown as rectangular, it should be apparent that more intricate or arabesque patterns can be employed without varying from the scope or spirit of the invention.

In addition, although the array has been shown in one embodiment as having bonding pads pre-formed across the top and bottom so that the die size is determined merely by scribing vertical scribe lines, it should also be understood that the bonding pads can be pre-placed vertically and the scribe lines located horizontally by the end user to fix the die size. Alternatively, there could be no pre-placed scribe lines in either direction. Thus the invention is to be limited only in accordance with the appended claims.

What is claimed is:

1. A semiconductor wafer for semi-custom integrated circuits comprising:
   an array of components arranged so that no areas are reserved without components for scribe lines in at least one of any two orthogonal directions;
   a plurality of cell areas containing interior components, said cell areas having a perimeter isolation region for electrically isolating said interior components from other components and said cell areas having a size sufficient to support a bonding pad;
   each of said cell areas containing components for at least one bipolar transistor;
   said cells being arranged in columns, each column having a width greater than a width required for a scribe line; and
   each of said cells including a nitride layer formed between an n-epitaxial layer and an oxide layer to prevent contamination at a scribe line cut.

2. The wafer of claim 1 wherein there are no areas reserved without components for scribe line sin either direction.

3. The wafer of claim 1 wherein a plurality of fixed parallel elongate scribe areas are reserved in a first direction only for scribe lines.

4. The wafer of claim 3 further comprising a plurality of fixed bonding pads adjacent said fixed scribe areas.

5. The wafer of claim 4 further comprising a plurality of components adjacent said bonding pads for forming power transistors.

6. The wafer of claim 3 further comprising:
   an array of identical cells between said scribe areas arranged in at least two rows; and
   an elongate region parallel to said scribe area between said rows of cells, said elongate region having a dimension in a direction orthogonal to said scribe areas which is less than a corresponding dimension of said rows of cells, such that said elongate region can be used for metal routing in digital applications and for forming capacitors in analog applications.

7. The wafer of claim 1 further comprising an array of identical cells, each cell including four electrically isolated transistor regions with internal components in each transistor region for forming at least one transistor.

8. The wafer of claim 1 further comprising:
an array of identical cells arranged in rows and columns; and
a passivation layer defining a plurality of scribe line areas, each scribe line area being orthogonal to said rows and extending through at least a portion of at least one column of said cells, said passivation layer also defining a plurality of variable bonding pad areas adjacent said scribe line areas.

9. The wafer of claim 8 wherein said variable bonding pad areas are in the same column of cells as said scribe line area.

10. The wafer of claim 1 wherein said cells are arranged in rows in said at least one direction so that a scribe line cut through any row of cells will be electrically isolated from adjacent rows of cells.

11. The wafer of claim 1 wherein said wafer includes layer formed between an n-epitaxial layer and an oxide layer to prevent contamination at a scribe line cut.

12. The wafer of claim 1 further comprising a plurality of electrostatic protection cells proximate said cell areas, each electrostatic protection cell comprising an elongate P region in an isolated n-epitaxial cell over a P substrate with contact openings at either side so that said electrostatic protection cell can be one of a crossunder and a vertical PNP transistor.

13. A die cut from the wafer of claims 1, 2, 3, 4, 5, 6, 7, 8, 9, 10, 11 or 12 having edges in at least one direction formed bY scribe lines through said components and having bonding pads formed in a plurality of cell areas in cells adjacent said edges.

14. A semiconductor wafer for semi-custom integrated circuits, comprising:
a plurality of fixed parallel scribe line areas without components extending in one direction;
a plurality of rows of cells extending between said fixed scribe line areas without interruption for scribe lines, at least two of said rows being between any two of said fixed scribe line areas;
a plurality of fixed bonding pad areas extending in rows on either side of each of said fixed scribe areas;
a plurality of electrically isolated cell areas in which of said rows of cells, each cell area containing components for forming at least one transistor and having an area sufficient to support a bonding pad;
a plurality of aligned columns formed by said cell areas, each column having a width greater than a width required for a scribe line;
a routing region between said two rows and said fixed scribe line areas; and
a plurality of components for forming power transistors adjacent said fixed bonding pad areas.

15. The wafer of claim 14 further comprising:
a passivation layer defining a plurality of variable scribe line areas orthogonal to said fixed scribe line areas through a portion of each of two adjacent columns of cells and defining bonding pad areas over cell areas in said adjacent columns of cells.

16. A semiconductor wafer for semi-custom integrated circuits, comprising:
a plurality of fixed parallel scribe line areas without components extending in one direction;
a plurality of rows of cells extending between said fixed scribe line areas without interruption for scribe lines, at least two of said rows being between any two of said fixed scribe line areas;
a plurality of fixed bonding pad areas extending in rows on either side of each of said fixed scribe line areas;
a plurality of electrically isolated cell areas in each of said rows of cells, each cell area having an area sufficient to support a bonding pad, each cell area including at least four electrically isolated transistor regions, each transistor region having components for forming at least one transistor;
a plurality of aligned columns formed by said cell areas, each column having a width greater than a width required for a scribe line; and
a routing region between said two rows and said fixed scribe line areas.

17. A semiconductor wafer for semi-custom integrated circuits, comprising:
a plurality of fixed parallel scribe line areas without components extending in one direction;
a plurality of rows of cells extending between said fixed scribe line areas without interruption for scribe lines, at least two of said rows being between any two of said fixed scribe line areas;
a plurality of fixed bonding pad areas extending in rows on either side of each of said fixed scribe areas;
a plurality of electrically isolated cell areas in each of said rows of cells, each cell area including at least four electrically isolated transistor regions, each transistor region having components for forming at least one transistor, each transistor region having an area sufficient to support a bonding pad; and
a plurality of aligned columns formed by said cell areas, each column having a width greater than a width required for a scribe line.

18. A semiconductor wafer for semi-custom integrated circuits, comprising:
a plurality of fixed parallel scribe line areas without components extending in one direction;
a plurality of rows of cells extending between said fixed scribe line areas without interruption for scribe lines, at least two of said rows being between any two of said fixed scribe line areas;
a plurality of fixed bonding pad areas extending in rows on either side of each of said fixed scribe areas;
a plurality of electrically isolated cell areas in each of said rows of cells, each cell area having an area sufficient to support a bonding pad, each cell area including at least four electrically isolated transistor regions, each transistor region having components for forming at least one transistor;
a plurality of aligned columns formed by said cell areas, each column having a width greater than a width required for a scribe line;
a routing region between said two rows and said fixed scribe line areas; and
a passivation layer defining a plurality of scribe line areas, each scribe line area being orthogonal to said rows and extending through at least a portion of at least one column of said cells, said passivation layer also defining a plurality of variable bonding pad areas adjacent said scribe line areas, said variable bonding pad areas being in the same column of cells as said scribe line area.

* * * * *